(12) United States Patent
Nakano et al.

(10) Patent No.: US 8,493,786 B2
(45) Date of Patent: Jul. 23, 2013

(54) SEMICONDUCTOR DEVICE FOR SHORT-CIRCUITING OUTPUT TERMINALS OF TWO OR MORE VOLTAGE GENERATOR CIRCUITS AT READ TIME AND CONTROL METHOD FOR THE SAME

(75) Inventors: Takeshi Nakano, Kawasaki (JP); Mikio Ogawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 372 days.

(21) Appl. No.: 12/822,587

(22) Filed: Jun. 24, 2010

(65) Prior Publication Data
US 2010/0329017 A1   Dec. 30, 2010

(30) Foreign Application Priority Data

Jun. 26, 2009  (JP) .................................. 2009-152642

(51) Int. Cl.
*G11C 16/04* (2006.01)
(52) U.S. Cl.
USPC ............ 365/185.18; 365/185.03; 365/185.23; 365/189.09; 365/189.15
(58) Field of Classification Search
USPC ............. 365/185.18, 185.03, 185.23, 189.09, 365/189.15
See application file for complete search history.

(56) References Cited

U.S. PATENT DOCUMENTS

| 8,077,523 B2 * | 12/2011 | Nakano et al. | ........... 365/185.23 |
|---|---|---|---|
| 8,116,132 B2 * | 2/2012 | Im | .............. 365/185.03 |
| 2008/0025098 A1 * | 1/2008 | Byeon et al. | ............ 365/185.18 |
| 2009/0262582 A1 * | 10/2009 | Chae et al. | .............. 365/185.19 |

FOREIGN PATENT DOCUMENTS

| JP | 8-255493 | 10/1996 |
|---|---|---|
| JP | 9-320288 | 12/1997 |
| JP | 11-134892 | 5/1999 |
| JP | 11-512864 | 11/1999 |
| JP | 2000-101036 | 4/2000 |
| JP | 2001-338493 | 12/2001 |
| JP | 2007-80478 | 3/2007 |

OTHER PUBLICATIONS

Office Action issued on Dec. 18, 2012 in the corresponding Japanese Patent Application No. 2009-152642 (with English Translation).

* cited by examiner

*Primary Examiner* — Toan Le
(74) *Attorney, Agent, or Firm* — Oblon, Spivak, McClelland, Maier & Neustadt, L.L.P.

(57) ABSTRACT

According to one embodiment, a semiconductor device includes a first voltage generator, a second voltage generator, a first MOS transistor, and a controller. The first voltage generator outputs a first voltage to a first node. The second voltage generator outputs a second voltage to a second node. The first MOS transistor is capable of short-circuiting the first node and second node. The controller performs a control operation to short-circuit the first node and second node by turning on the first MOS transistor. The controller controls a period in which the first MOS transistor is kept in an on state based on time.

20 Claims, 9 Drawing Sheets

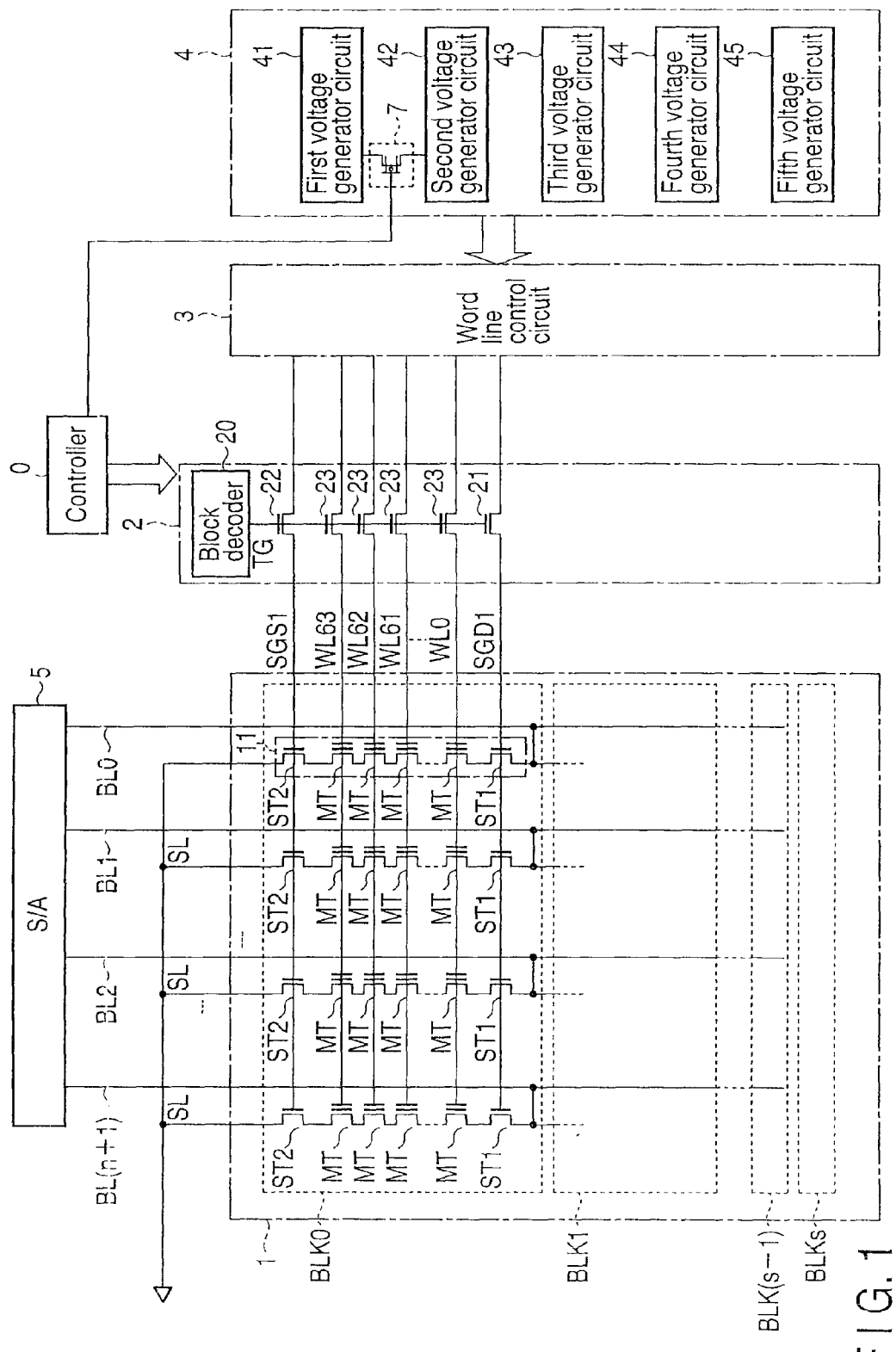
F I G. 1

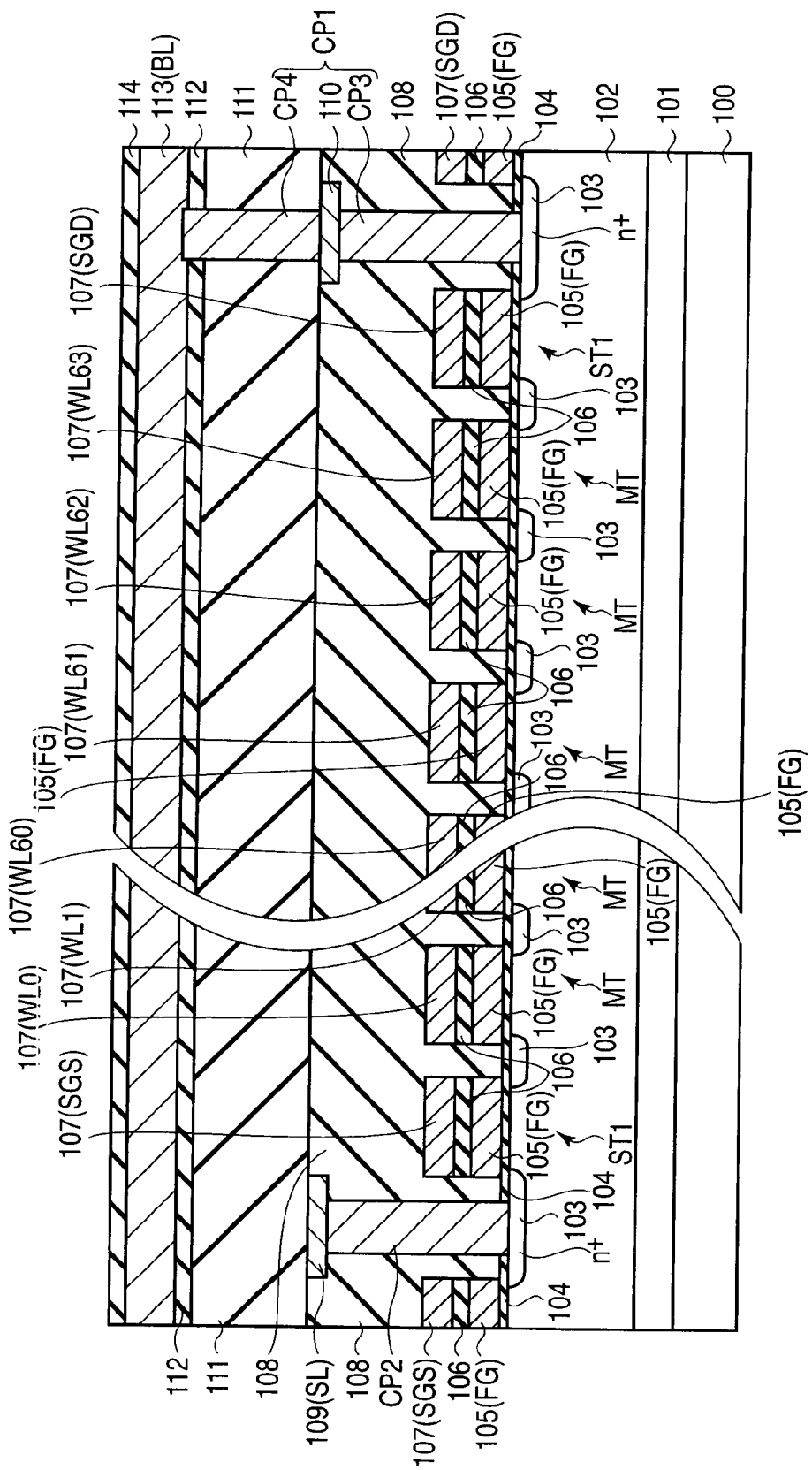
F I G. 2

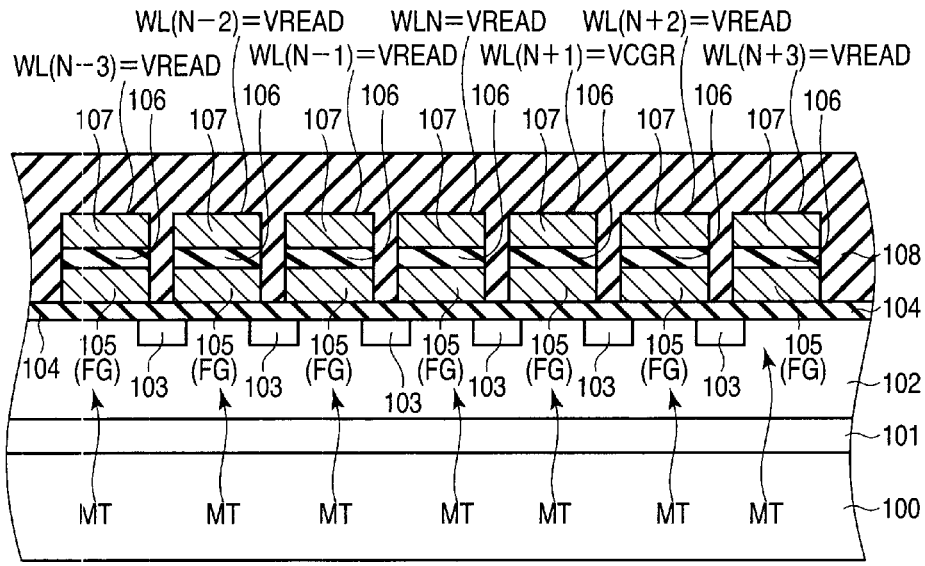
F I G. 6A
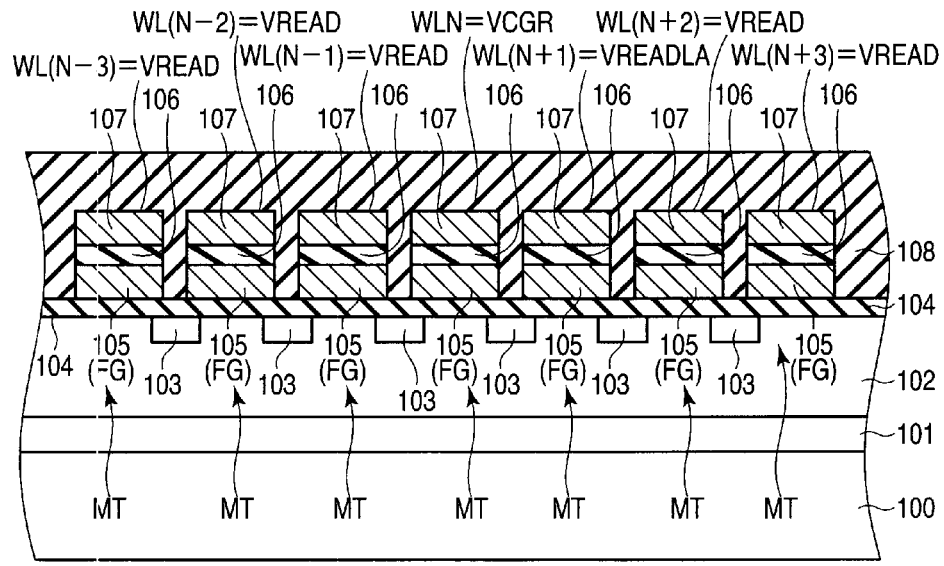
F I G. 6B

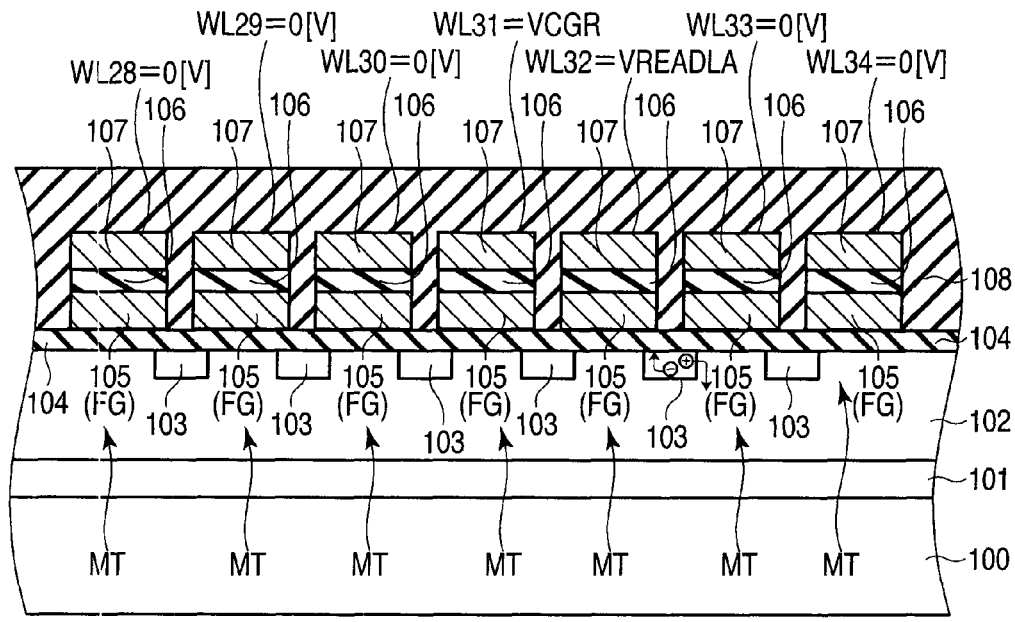
F I G. 9
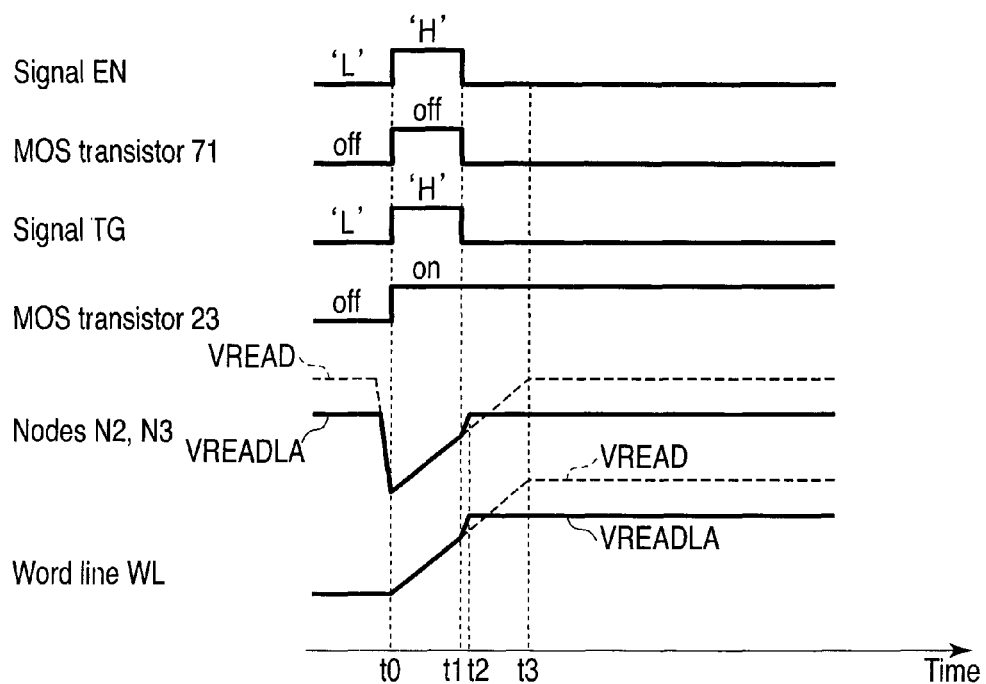
F I G. 10

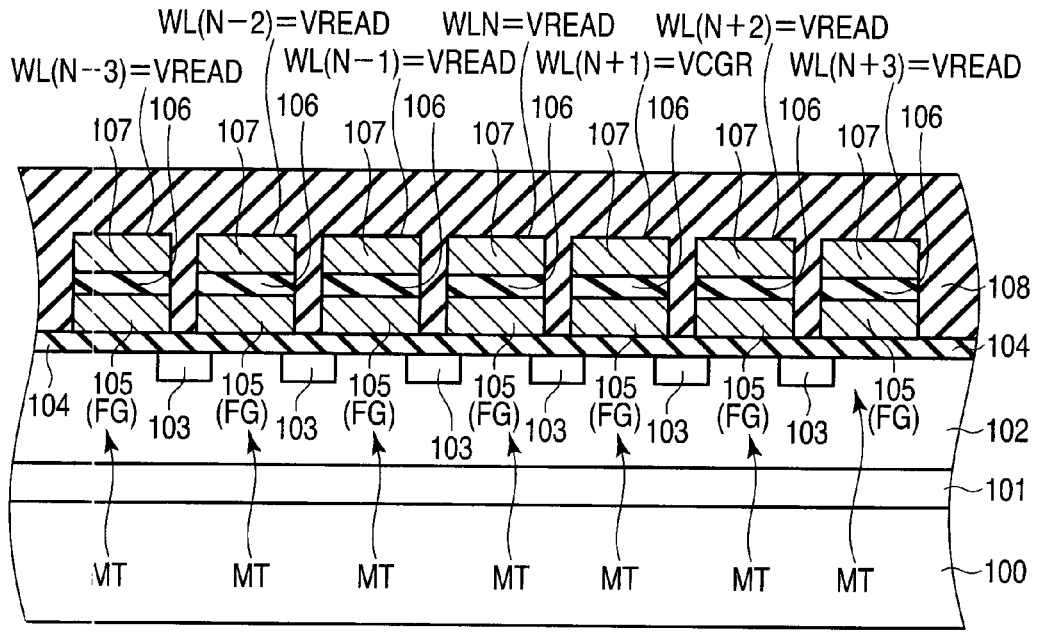
F I G. 12A
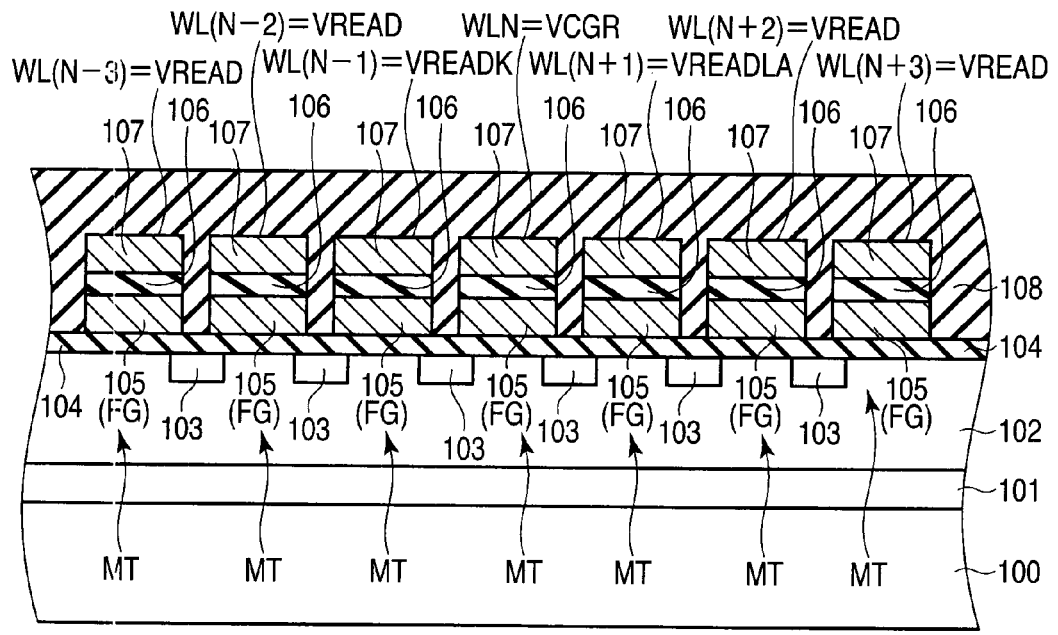
F I G. 12B

SEMICONDUCTOR DEVICE FOR SHORT-CIRCUITING OUTPUT TERMINALS OF TWO OR MORE VOLTAGE GENERATOR CIRCUITS AT READ TIME AND CONTROL METHOD FOR THE SAME

CROSS-REFERENCE TO RELATED APPLICATIONS

This application is based upon and claims the benefit of priority from Japanese Patent Application No. 2009-152642, filed Jun. 26, 2009; the entire contents of which are incorporated herein by reference.

FIELD

Embodiments described herein related generally to a semiconductor device applied to a nonvolatile semiconductor memory device.

BACKGROUND

Recently, the distances between adjacent word lines and between adjacent bit lines are more narrow as the device is further miniaturized. That is, the distance between memory cell transistors is narrow. Therefore, for example, if data is written into a memory cell transistor in which binary data is held, the threshold distribution of a memory cell transistor in which data has been already written varies due to variation in the threshold distribution of a memory cell transistor adjacent to the above memory cell transistor. In the following description, the variation in the threshold distribution is referred to as a coupling effect.

Therefore, the threshold value of the memory cell transistor is raised from the initial read level and it becomes necessary to transfer a higher voltage in order to turn on the memory cell transistor. That is, a voltage generator circuit that generates plural voltages is required. In Jpn. Pat. Appln. KOKAI Publication No. H11-134892, voltage generator circuits whose current supply rates are different are described.

In this case, if the above high voltage is transferred to the control gate of a memory cell transistor adjacent to a memory cell transistor before the high voltage is transferred to the control gate of the latter memory cell transistor, gate induced drain leakage (GIDL) will occur between the impurity diffusion layer and the memory cell transistor.

BRIEF DESCRIPTION OF THE DRAWINGS

FIG. 1 is a block diagram of a NAND flash memory according to a first embodiment;

FIG. 2 is a cross-sectional view of the NAND flash memory according to the first embodiment;

FIGS. 6A, 6B show a data read operation of the memory cell transistor according to the first embodiment, FIG. 6A showing a first read step and FIG. 6B showing a second read step;

FIG. 9 is a cross-sectional view of the conventional NAND flash memory;

FIG. 10 is a time chart for illustrating a voltage transmission operation at a data read time in a NAND flash memory according to a modification corresponding to the first embodiment;

FIGS. 12A, 12B show a data read operation of a memory cell transistor according to the second embodiment, FIG. 12A showing a first read step and FIG. 12B showing a second read step;

DETAILED DESCRIPTION

Figure 3:
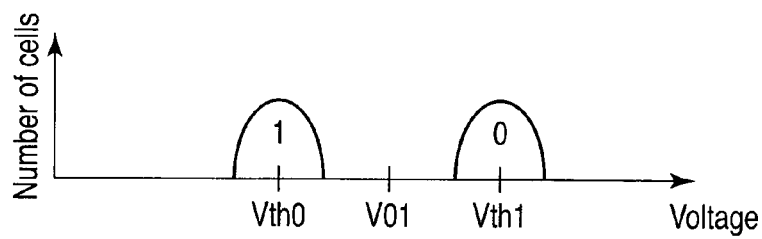
FIG. 3 shows the threshold distribution of a memory cell transistor according to the first embodiment.

Next, a first embodiment is explained with reference to the accompanying drawings. In the explanation, common reference symbols are attached to common portions throughout the drawings.

In general, according to one embodiment, a semiconductor device includes a first voltage generator circuit, a second voltage generator circuit, a first MOS transistor, and a controller. The first voltage generator circuit outputs a first voltage to a first node. The second voltage generator circuit outputs a second voltage to a second node. The first MOS transistor is capable of short-circuiting the first and second nodes. The controller performs a control operation to short-circuit the first and second nodes by turning on the first MOS transistor. The controller controls a period in which the first MOS transistor is kept in the on state based on time.

[First Embodiment]

The semiconductor device according to the first embodiment is explained with reference to FIG. 1. The summary of this embodiment is to short-circuit the output terminals of two or more voltage generator circuits that generate various voltages at a read time. Therefore, voltage transfer timings of voltages applied to plural word lines WL are set to the same timing. First, the configuration of the semiconductor device according to the first embodiment is explained.

In FIG. 1, the semiconductor device according to the first embodiment is shown. As one example, a NAND flash memory is provided. As shown in FIG. 1, the NAND flash memory includes a memory cell array 1, row decoder 2, word line control circuit 3, voltage generator circuit 4, sense amplifier 5 and controller 6. First, the memory cell array 1 is explained.

<Configuration Example of Memory Cell Array 1>

As shown in FIG. 1, the memory cell array 1 includes plural blocks BLK0 to BLKs (s is a natural number). Each of the blocks BLK0 to BLKs includes plural NAND strings 11 including nonvolatile memory cell transistors MT serially connected.

For example, each of the NAND strings 11 includes 64 memory cell transistors MT and select transistors ST1, ST2. The memory cell transistor MT has an FG structure having a charge storage layer (for example, conductive film) formed above a semiconductor substrate with a gate insulating film disposed therebetween, an inter-level insulating film formed on the charge storage layer and a control gate electrode formed on the inter-level insulating film.

The number of memory cell transistors MT is not limited to 64 and may be set to 128, 256 or 512 and the number is not limitative. Further, adjacent ones of the memory cell transistors MT commonly have the source or drain. The memory cell transistors MT are arranged to have the current paths serially connected between the select transistors ST1 and ST2. The drain region on one-end side of the series-connected memory cell transistors MT is connected to the source region of the select transistor ST1 and the source region on the other end side is connected to the drain region of the select transistor ST2.

The charge storage layer of the memory cell transistor may be formed of a conductive film (floating gate) such as a polysilicon film, for example, but may be formed of an insulating film (MONOS structure). In this case, the laminated gate includes a charge storage layer formed of an insulating film on the gate insulating film, a block layer formed of a ferroelectric material having a dielectric constant higher than that of the charge storage layer on the charge storage layer and a control gate formed on the block layer.

The control gate of the memory cell transistor MT functions as a word line WL, the drain is electrically connected to a bit line BL and the source is electrically connected to a source line SL.

The control gate electrodes of the memory cell transistors MT arranged on the same row are commonly connected to a corresponding one of word lines WL0 to WL63 and the gate electrodes of the select transistors ST1, ST2 arranged on the same row are commonly connected to select gate lines SGD1, SGS1, respectively. For simplifying the explanation, in the following explanation, the word lines WL0 to WL63 may simply be referred to as word lines WL if they are not separately used. Further, the drains of the select transistors ST1 arranged on the same column in the memory cell array 1 are commonly connected to a corresponding one of bit lines BL0 to BLn. In the following description, the bit lines BL0 to BLn are referred to as bit lines BL if they are not separately used (n is a natural number). The sources of the select transistors ST2 are commonly connected to the source line SL.

Further, data is simultaneously written into the plural memory cell transistors MT connected to the same word line WL and the unit of the memory cell transistors is called a page. Further, data items of the plural NAND strings 11 are simultaneously erased in the block BLK unit.

<Cross-Sectional View of Memory Cell Array 1>

Next, the cross section of the memory cell array 1 in the blocks BLK0 to BLKs with the above configuration is explained with reference to FIG. 2. FIG. 2 is a cross-sectional view of the NAND string 11 taken along the bit line BL direction in FIG. 1.

As shown in FIG. 2, an n-type well region 101 is formed in the surface area of a p-type semiconductor substrate 100. A p-type well region 102 is formed in the surface area of the n-type well region 101. A gate insulating film 104 is formed on the p-type well region 102. Gate electrodes of memory cell transistors MT and select transistors ST1, ST2 are formed on the gate insulating film 104.

The gate electrodes of the memory cell transistors MT and select transistors ST1, ST2 are formed with the laminated structure having an FG structure. The laminated structure is obtained by sequentially forming a conductive film 105, inter-level insulating film 106 and polysilicon layer 107 on the gate insulating film 104. The surface portion of the polysilicon layer 107 is modified into a metal silicide form.

In the memory cell transistor MT explained above, the gate insulating film 104 functions as a tunnel insulating film. The conductive film 105 functions as a floating gate (FG) and the polysilicon layer 107 functions as a control gate. The polysilicon layers 107 that are adjacent in the word line WL direction intersecting with the bit line BL direction in FIG. 1 are commonly connected and function as a control gate electrode (word line WL). In the following description, the conductive film 105 and polysilicon layer 107 may be referred to as a charge storage layer 105 and control gate 107, respectively.

Further, in the select transistors ST1, ST2, the conductive films 105 that are adjacent in the word line WL direction are commonly connected. Then, the conductive films 105 function as select gate lines SGS, SGD. At this time, only the polysilicon layer 107 may function as a select gate line. In this case, the potentials of the polysilicon layers 107 of the select transistors ST1, ST2 are set at a constant potential or set into a floating state.

In portions of the surface area of the p-well region 102 that lie between the gate electrodes, $n^+$-type impurity diffusion layers 103 are formed. The $n^+$-type impurity diffusion layer 103 is commonly used by the adjacent transistors and functions as a source (S) or drain (D). Further, a region between the adjacent source and drain functions as a channel region used as an electron moving region. The gate electrodes, $n^+$-type impurity diffusion layers 103 and channel regions configure transistors used as the memory cell transistors MT and select transistors ST1, ST2.

On the p-type semiconductor substrate 100, an inter-level insulating film 108 is formed to cover the memory cell transistors MT and select transistors ST1, ST2. In the inter-level insulating film 108, a contact plug CP2 that reaches the $n^+$-type impurity diffusion layer (source) 103 of the select transistor ST2 on the source side is formed. In the surface area of the inter-level insulating film 108, a metal interconnection layer 109 connected to the contact plug CP2 is formed. The metal interconnection layer 109 functions as a part of the source line SL. In the inter-level insulating film 108, a contact plug CP3 that reaches the $n^+$-type impurity diffusion layer (drain) 103 of the select transistor ST1 on the drain side is formed. A metal interconnection layer 110 connected to the contact plug CP3 is formed in the inter-level insulating film 108. An inter-level insulating film 111 is formed on the inter-level insulating film 108. An inter-level insulating film 112 is formed on the inter-level insulating film 111. A metal interconnection layer 113 is formed on the inter-level insulating film 112. The metal interconnection layer 113 functions as a bit line BL. A contact plug CP4 whose upper surface contacts with the metal interconnection layer 113 and whose bottom surface contacts with the metal interconnection layer 110 is formed in the inter-level insulating films 111, 112. The contact plugs CP3, CP4 and metal interconnection layer 110 function as a contact plug CP1. Further, an insulating film 114 is formed on the metal interconnection layer 113.

<Threshold Distribution of Memory Cell Transistor MT>

Next, the threshold distribution of the memory cell transistor MT is explained with reference to FIG. 3. FIG. 3 is a graph showing the threshold distribution on the abscissa and the number of cells of the memory cell transistors MT on the ordinate.

As shown in FIG. 3, each of the memory cell transistors MT can hold binary (2-level) data (one-bit data), for example. That is, the memory cell transistor MT can hold two types of data items of "1" and "0" in an order starting from the lowest threshold voltage Vth.

The threshold voltage Vth0 of "1" data in the memory cell transistor MT is set to satisfy the relationship of Vth0<V01. The threshold voltage Vth1 of "0" data is set to satisfy the relationship of V01<Vth1. Thus, the memory cell transistor MT can hold 1-bit data of "0" data and "1" data according to the threshold voltage.

The threshold voltage varies by injecting charges into the charge storage layer. Further, the memory cell transistor MT may be formed to hold data of four or more values.

<Row Decoder 2>

Next, the row decoder 2 is explained with reference to FIG. 1 again. The row decoder 2 includes a block decoder 20 and n-channel MOS transistors 21 to 23. The block decoder 20 decodes a block address supplied from the controller 6 at the data write operation time, read operation time and erase time. Then, the block decoder 20 selects one of the blocks BLK based on the decoded result. That is, the block decoder 20 selects the MOS transistors 21 to 23 corresponding to the block BLK that contains the selected memory cell transistor MT and turns on the MOS transistors 21 to 23 via a control line TG.

At this time, a block select signal is output from the block decoder 20. The block select signal is a signal used to permit the row decoder 2 to select one of the plural memory blocks BLK0 to BLKs at the data read time, write time or erase time. As a result, the row decoder 2 selects the row direction of the memory cell array 1 corresponding to the selected block BLK. That is, the row decoder 2 applies voltages supplied from the voltage generator circuit 4 via the word line control circuit 3 to the select gate lines SGD1, SGS1 and word lines WL0 to WL63 based on the select signal supplied from the block decoder 20.

<Word Line Control Circuit 3>

Next, the word line control circuit 3 is explained. In this case, the function of the word line control circuit 3 is explained. The word line control circuit 3 transfers various voltages generated from the voltage generator circuit 4 to adequate word lines WL assigned by the row decoder 2 via the row decoder 2.

For example, it is supposed that the memory cell transistor MT to be read is connected to the word line WL31. In this case, the word line control circuit 3 transfers a voltage corresponding to read data held by the memory cell transistor MT to the word line WL31. Then, the word line control circuit 3 performs a control operation to transfer a voltage that turns on the memory cell transistor MT to the word lines WL0 to WL30 and word lines WL32 to WL63 other than the word line WL31.

A signal sgd is transferred to the gate of the select transistor ST1 via the select gate line SGD1 by means of the word line control circuit 3. Further, a signal sgs is transferred to the gate of the select transistor ST2 via the select gate line SGS1 by means of the word line control circuit 3. Each of the signal sgd and signal sgs is a signal in which the 'H' level is set to voltage VDD (for example, 1.8 [V]) and the 'L' level is set to 0 [V]. The select transistors ST1, ST2 are turned on by voltage VDD.

<Voltage Generator Circuit 4>

Next, the voltage generator circuit 4 is explained. As shown in FIG. 1, the voltage generator circuit 4 includes a first voltage generator circuit 41, second voltage generator circuit 42, third voltage generator circuit 43, fourth voltage generator circuit 44 and fifth voltage generator circuit 45. The first voltage generator circuit 41 to fifth voltage generator circuit 45 are explained with reference to FIG. 4.

Figure 4:
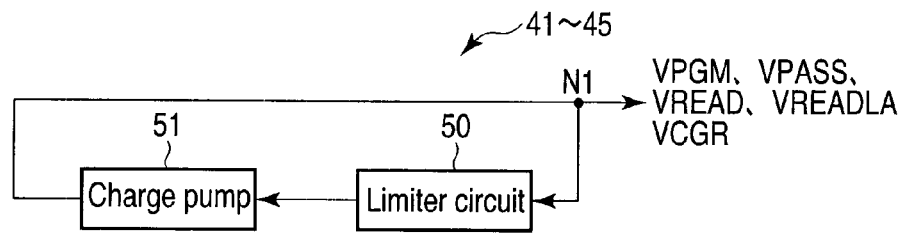
FIG. 4 is a block diagram of a voltage generator circuit according to the first embodiment.

As shown in FIG. 4, each of the first voltage generator circuit 41 to fifth voltage generator circuit 45 includes a limiter circuit 50 and charge pump circuit 51. The charge pump circuit 51 generates voltages required for performing, for example, the data write operation, erase operation and read operation that are controlled by the controller 6. Each voltage thus generated is output from the node N1 and supplied to, for example, the row decoder 2 of the NAND flash memory via the word line control circuit 3.

The limiter circuit 50 controls the charge pump circuit 51 according to the potential of the node N1 monitoring the potential of the node N1. That is, the limiter circuit 50 stops the pumping operation of the charge pump circuit 51 to drop the potential of the node N1 if the potential of the node N1 is higher than a preset potential.

On the other hand, if the potential of the node N1 is lower than the preset potential, the limiter circuit instructs the charge pump circuit 51 to perform the pumping operation to raise the potential of the node N1.

Next, voltages generated from the first voltage generator circuit 41 to fifth voltage generator circuit 45 are explained. The first voltage generator circuit 41 generates voltage VREAD and transfers voltage VREAD to unselected word lines at the data read time. Voltage VREAD is a voltage used to turn on the memory cell transistor MT irrespective of data to be held.

The second voltage generator circuit 42 generates voltage VREADLA. Voltage VREADLA generated from the second voltage generator circuit 42 is transferred to the unselected word line WL adjacent to the drain side of the selected word line WL via the row decoder 2. Like voltage VREAD, voltage VREADLA is a voltage used to turn on the memory cell transistor MT connected to the unselected word line WL and is set higher than voltage VREAD as required. That is, voltage VREADLA may be set lower than voltage VREAD. The magnitude of voltage VREADLA is controlled by the limiter circuit 50.

The third voltage generator circuit 43 generates voltage VCGR at the data read time. Voltage VCGR is transferred to the selected word line WL. Voltage VCGR is a voltage corresponding to data to be read from the memory cell transistor MT.

The fourth voltage generator circuit 44 generates voltage VPGM at the data write time and transfers voltage VPGM to the selected word line WL. Voltage VPGM is a voltage with such magnitude that injects charges of the channel in the memory cell transistor MT into the charge storage layer and the shifts threshold voltage of the memory cell transistor MT to another level.

The fifth voltage generator circuit 45 generates voltage VPASS and transfers voltage VPASS to the unselected word lines WL. Voltage VPASS is a voltage used to turn on the memory cell transistor MT. If the first voltage generator circuit 41 to fifth voltage generator circuit 45 are not separately used, they are simply referred to as the voltage generator circuit 4.

<Sense Amplifier 5>

The sense amplifier 5 senses and amplifies data of the memory cell transistor MT read to the bit line BL at the data read time. More specifically, the sense amplifier 5 precharges the bit line BL to voltage VDD. Then, the sense amplifier 5 senses a voltage (or current) of the bit line BL.

The sense amplifier transfers voltage VDD transferred from the voltage generator circuit 4 to the bit line BL at the data write time.

<Control Portion 6>

Next, the controller 6 is explained. The controller 6 short-circuits the output terminals of the first voltage generator circuit 41 and second voltage generator circuit 42 at the read time. As a result, voltages output from the output terminals of the first voltage generator circuit 41 and second voltage generator circuit 42 rise at the same rising rate.

Further, the controller 6 controls the whole operation of the NAND flash memory. That is, it executes an operation sequence of the data write operation, read operation and erase operation based on the address and command supplied from a host (not shown).

The controller 6 generates a block select signal/column select signal based on the address and operation sequence. The controller 6 outputs the block select signal to the row decoder 2.

<First, Second Voltage Generator Circuits 41, 42 and Short Circuit 7>

Figure 5:
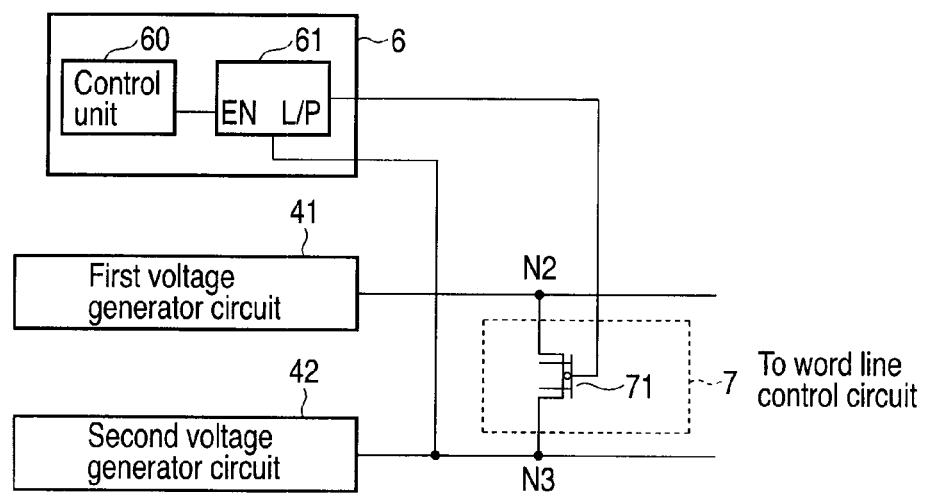
FIG. 5 is a block diagram of a voltage generator circuit and controller according to the first embodiment.

Next, configuration examples of the short circuit 7 and the first, second voltage generator circuits 41, 42 explained above are explained with reference to FIG. 5. FIG. 5 is a block diagram of the controller 6, short circuit 7, first voltage generator circuit 41, and second voltage generator circuit 42.

The controller 6 includes a control unit 60 and local pump 61. The local pump 61 outputs a signal of 'L' or 'H' level to the short circuit 7 according to enable signal EN (indicated by EN in FIG. 5) supplied from the control unit 60.

The local pump 61 is connected to a node N3 that is the output terminal of the second voltage generator circuit 42. That is, the local pump 61 applies a voltage to the gate electrode of a MOS transistor 71 with the potential of the node N3 used as a reference voltage. In other words, the voltage applied to the gate of the MOS transistor 71 by the local pump 61 is set at least equal to a value that is not smaller than the sum of the reference voltage of the node N3 and the threshold voltage of the MOS transistor 71. In this case, if the threshold voltage of the MOS transistor 71 is set to $Vth_{71}$, a signal of 'H' level output from the local pump 61 is set to a voltage (voltage $Vth_{71}$+potential of the node N3). The MOS transistor 71 is turned on by the signal of 'H' level.

Further, the node N2 is connected to the output terminal of the first voltage generator circuit 41 and the node N3 is connected to the output terminal of the second voltage generator circuit 42 as described before. Extensions of the nodes N2 and N3 are electrically connected to the word lines WL via the word line control circuit 3 and row decoder 2 described before.

The short circuit 7 includes the MOS transistor 71. The MOS transistor 71 is a n-type MOS transistor with a higher withstand voltage than those of the MOS transistors 21 to 23. Specifically, the MOS transistor is an n-type intrinsic MOS transistor (that is hereinafter referred to as an I-type MOS transistor).

One end of the current path of the MOS transistor 71 is connected to the node N2, the other end thereof is connected to the node N3 and the gate thereof is applied with an output of the local pump 61. That is, the MOS transistor 71 is turned on according to an output of the local pump 61 to short-circuit the nodes N2 and N3. The potentials of the nodes N2 and N3 are set equal to the same potential if the nodes N2 and N3 are short-circuited.

The MOS transistor 71 may be an n-type depletion MOS transistor (that is hereinafter referred to as a D-type MOS transistor) with high withstand voltage or an n-type enhancement MOS transistor (that is hereinafter referred to as an E-type MOS transistor) with high withstand voltage. However, it is more preferable to use the I-type MOS transistor. The reason is that the on/off switching speed is higher if the absolute value of the threshold voltage is smaller.

Next, the threshold characteristics of the E-type, E-type and I-type MOS transistors are explained. The threshold voltage of the E-type MOS transistor is the highest among them and is positioned on the positive side with respect to the threshold voltages of the D-type and I-type MOS transistors.

That is, in a case where the threshold voltage thereof is set to $Vth_E$ and when the potential of the node N2 or N3 is set to 0 [V], the MOS transistor 71 is turned on if a voltage higher than or equal to voltage $Vth_E$ is applied to the gate thereof. Further, if a voltage is lower than voltage $Vth_E$ is applied, the MOS transistor 71 is turned off.

The threshold voltage of the D-type MOS transistor is the lowest and is positioned on the negative side. That is, in a case where the threshold voltage thereof is set to $Vth_D$ and when the potential of the node N2 or N3 is set to 0 [V], the MOS transistor 71 is turned on if a voltage higher than or equal to $Vth_D$ is applied to the gate thereof. Further, if a voltage that lies on the negative side with respect to voltage $Vth_D$ is applied, the MOS transistor 71 is turned off.

The threshold voltage of the I-type MOS transistor is set between the threshold voltages of the D-type and E-type MOS transistors and is positioned between 0 [V] and voltage $Vth_D$. It is supposed that the threshold voltage thereof is set to $Vth_I$ and the potential of the node N2 or N3 is set to 0 [V]. In this case, if a voltage higher than or equal to $Vth_I$ is applied to the gate thereof, the MOS transistor 71 is turned on. Further, if a voltage that lies on the negative side with respect to voltage $Vth_I$ is applied, the MOS transistor 71 is turned off.

The local pump 61 according to this embodiment generates a positive potential. For this reason, it is preferable to use an I-type MOS transistor with a low threshold voltage as shown in FIG. 5 as a MOS transistor that can be rapidly switched from the off state to the on state and maintain the MOS transistor 71 in the on state when the gate potential is set at 0 [V] without driving the local pump 61.

Further, if the I-type MOS transistor is used, the MOS transistor 71 is turned off by applying a back-bias voltage of approximately 2 [V] to the node N2 or N3.

If the D-type MOS transistor is used, the MOS transistor 71 is turned off by applying a back-bias voltage of approximately 4 [V] to the node N2 or N3. If the MOS transistor 71 is used as the E-type MOS transistor, it is unnecessary to apply the above back-bias voltage.

<Read Operation of NAND Flash Memory>

Next, the read operation of the NAND flash memory is explained with reference to FIGS. 6A and 6B. FIGS. 6A, 6B are views showing a state in which data is read from the memory cell transistor MT corresponding to an Nth (N is a natural number) word line WL with much attention paid to the memory cell transistor MT in the cross-sectional view of the memory cell array 1 explained in FIG. 2. That is, the Nth word line WL is used as a selected word line WL.

<Step 1>

First, it is supposed that data of the memory cell transistor MT whose control gate 107 is connected to a selected word line WLN is read. In this case, the third voltage generator circuit 43 transfers voltage VCGR to the memory cell transistor MT that is adjacent to the drain side of the selected word line WLN. That is, it transfers voltage VCGR to an unselected word line WL(N+1).

For example, in the case of N=31, the third voltage generator circuit 43 transfers voltage VCGR to the word line WL32 adjacent to the selected word line WL31. As a result, it becomes possible to grasp the threshold distribution of the memory cell transistor MT corresponding to the word line WL32. That is, even if the threshold distribution of the memory cell transistor MT is deviated from the initially designed threshold distribution, the threshold distribution of the memory cell transistor MT can be grasped by performing the above read step.

In other words, since voltage VCGR is set to a voltage corresponding to data to be read from the memory cell transistor MT, the threshold distribution of the memory cell transistor MT can be confirmed by use of the value of voltage VCGR that turns on the memory cell transistor MT.

A value of voltage VREADLA generated by the second voltage generator circuit is set by use of the value of voltage VCGR. In this case, it is supposed that voltage VREADLA is set equal to voltage (VREAD±α).

If the threshold distribution of the memory cell transistor MT is high, voltage VREADLA=voltage (VREAD+α) and if the threshold distribution is low, voltage VREADLA=voltage (VREAD−α).

<Step 2>

In step 2, voltage VCGR is transferred to the control gate 107 of the memory cell transistor MT connected to the selected word line WLN. At this time, the second voltage generator circuit 42 transfers voltage VREADLA to the word line WL(N+1) adjacent to the word line WLN.

Further, since N=31 and (N−1)=32 as described above, the second voltage generator circuit 42 transfers voltage VREAD to the other word lines WL0 to WL30 and word lines WL33 to WL63.

At this time, voltage VREADLA transferred to the word line WL(N+1) is set to a voltage corresponding to the threshold distribution of the memory cell transistor MT whose control gate 107 is connected to the word line WL(N+1) in step 1. As a result, the memory cell transistor MT connected to the word line WL is turned on and a data read operation is performed by means of the sense amplifier 5 via the bit line BL (not shown).

<Voltage Transfer Operation at Read Operation Time (First Case)>

Next, the voltage transfer operation at the read operation time of the NAND flash memory is explained with reference to FIG. 7. In this case, it is supposed that voltage VREADLA generated from the second voltage generator circuit 42 is higher than voltage VREAD. That is, voltage VREADLA=voltage (VREAD+α).

Figure 7:
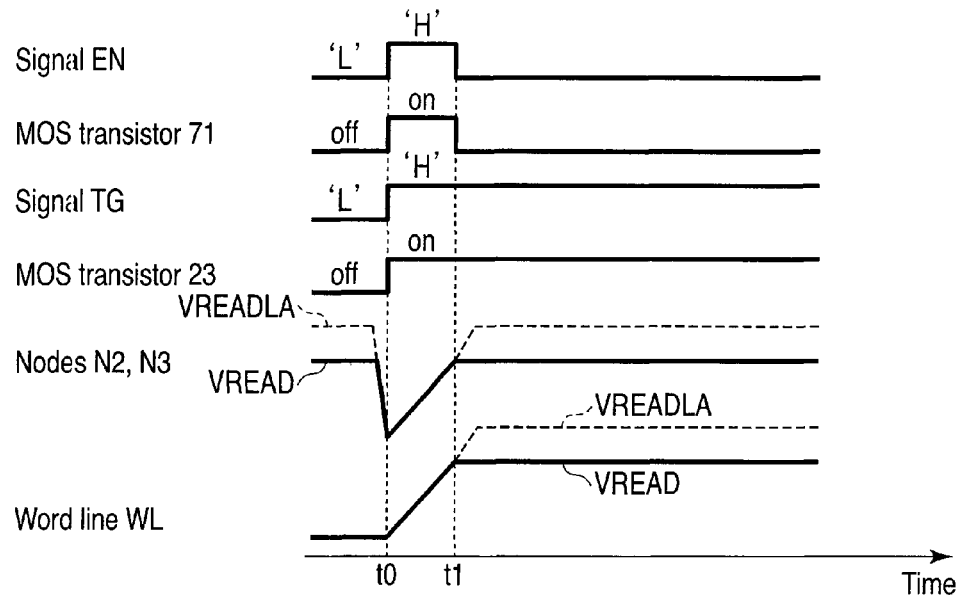
FIG. 7 is a time chart for illustrating a voltage transmission operation at a data read time in the NAND flash memory according to the first embodiment.

FIG. 7 is a time chart of enable signal EN applied to the local pump 61, a potential applied to the gate of the MOS transistor 71, signal TG, the on-off state of the MOS transistor 23, potentials of the nodes N2, N3 and potentials of the word lines WL.

Further, for the nodes N2, N3 in the drawing, the solid line indicates the potential of the node N2 and the broken lines indicate the potential of the node N3. The timing of the voltage transfer operation is controlled by means of the controller 6. In the following description, this is true in all of the embodiments.

<Before Time t0>

As shown in FIG. 7, signal TG is set to the 'L' level before time t0. Therefore, the MOS transistor 23 is turned off. Further, enable signal EN is set at the 'L' level. Therefore, the MOS transistor 71 is also turned off. As a result, the potentials of the nodes 1'2, N3 are respectively maintained at voltage VREAD and voltage VREADLA.

(Time t0>

Next, enable signal EN is set to the 'H' level by means of the control unit 60 at time to. Thus, the local pump 61 outputs a signal of 'H' level to the gate of the MOS transistor 71. As a result, the MOS transistor 71 is turned on. In other words, the nodes N2 and N3 are short-circuited. Then, signal TG output from the block decoder 20 of the row decoder 2 is set to the 'H' level to turn on the MOS transistor 23. Therefore, loads (parasitic capacitors of the word lines WL) are applied to the output terminals of the first voltage generator circuit 41 and second voltage generator circuit 42. At this time, signal TG maintains the 'H' level after time t0. Therefore, the potentials of the nodes N2, N3 are temporarily set to 0 [V] from respective voltage VREAD and voltage VREADLA generated from the first, second voltage generator circuits 41, 42.

Then, after time t0, the potentials of the nodes N2, N3 rise at the same rate in a period in which enable signal EN is kept at the 'H' level or in a period in which the MOS transistor 71 is kept in the on s=ate. Likewise, the potentials of the word lines WL connected to the nodes N2, N3 also rise at the same rate.

<Time t1>

When time t1 is reached, the potentials of the nodes N2, N3 and the unselected word lines WL are reached voltage VREAD. Then, the controller 6 switches enable signal EN to the 'L' level. That is, an output of the local pump 61 is set to the 'L' level. As a result, the MOS transistor 71 is turned off.

Therefore, the nodes N2 and N3 are electrically isolated. Therefore, the potential of the node N2 is set to voltage VREAD and the potential of the unselected word line WL is maintained at voltage VREAD.

<After Time t1>

After time t1, the potential of the node N3 rises to voltage VREADLA. This is because the second voltage generator circuit 42 generates voltage VREADLA. That is, the potential of the unselected word line WL to which voltage VREADLA is transferred rises to voltage VREADLA after time t1.

<Voltage Transfer Operation at Read Operation Time (Second Case)>

Figure 8:
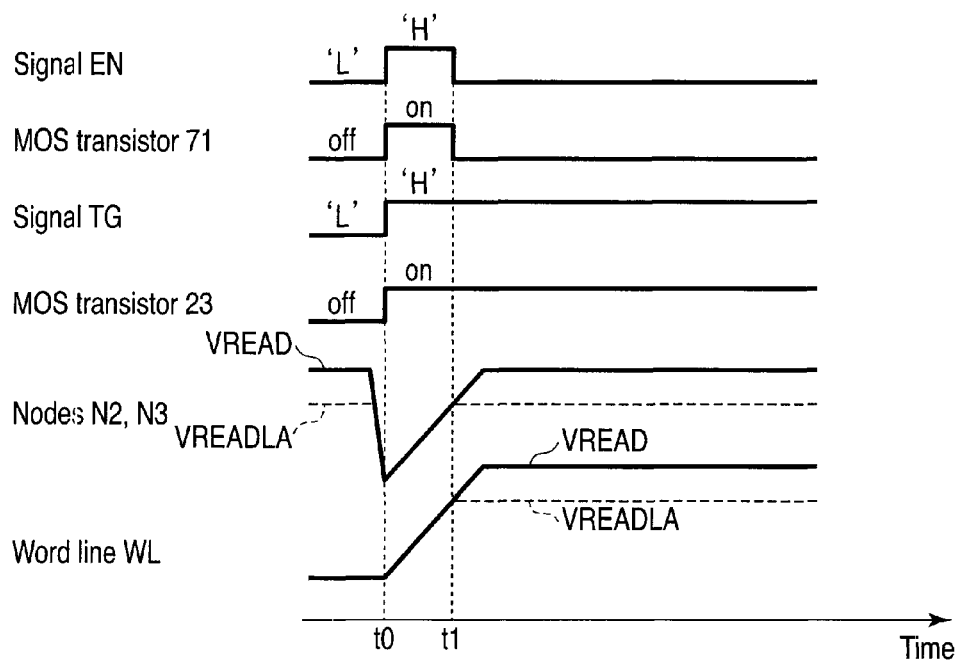
FIG. 8 is a time chart for illustrating a voltage transmission operation at a data read time in the NAND flash memory according to the first embodiment.

Next, the voltage transfer operation of the NAND flash memory is explained with reference to FIG. 8. FIG. 8 shows a case wherein voltage VREAD generated from the first voltage generator circuit 41 is higher than voltage VREADLA. That is, voltage VREADLA=voltage (VREAD−α). Further, the explanation for the same operation as the read operation (first case) explained above is omitted.

As shown in FIG. 8, the potential of the node N3 rises at the same rising rate as the potential of the node N2 after time t0 like the case of the above operation (first case). As described above, voltage VREAD>voltage VREADLA. Therefore, the controller 6 switches enable signal EN to the 'L' level at time t1 at which the potentials of the nodes N2, N3 reach voltage VREADLA. That is, an output of the local pump 61 is set to the 'L' level. As a result, the MOS transistor 71 is turned off and the nodes N2 and N3 are electrically isolated. Therefore, the potential of the node N3 is maintained at voltage VREADLA. In other words, the potential of the unselected word line WL electrically connected via the node N3 is also maintained at voltage VREADLA.

After time t1, the potential of the node N2 rises to voltage VREAD. This is because the first voltage generator circuit 41 generates voltage VREAD. That is, the potential of the unselected word line WL to which voltage VREAD is transferred rises to voltage VREAD after time t1.

<Effect of this Embodiment>

In a semiconductor device and the control method for the semiconductor device according to this embodiment, the effect (1) can be attained.

(1) Operation Reliability can be Enhanced:

The effect of this embodiment is explained below. In the semiconductor device and the control method for the semiconductor device according to this embodiment, the short circuit 7 that short-circuits the output terminal (node N2) of the first voltage generator circuit 41 and the output terminal (node N3) of the second voltage generator circuit 42 and the controller 6 that has a function of controlling the above circuit based on time are provided as shown in FIG. 5. When explaining the effect, for example, a case wherein the word line WL31 is used as the selected word line WL is considered like the above case.

According to this embodiment, the controller 6 short-circuits the output terminals of the first voltage generator circuit 41 and second voltage generator circuit 42 as required. In the case of short-circuiting, the parasitic capacitors of the word lines WL0 to WL30 and word lines WL33 to WL63 are applied as loads to the first voltage generator circuit 41 and second voltage generator circuit 42. That is, the load of the first voltage generator circuit 41 is alleviated.

Further, it can be prevented that only the word line WL32 is dealt with as the load (parasitic capacitor) as viewed from the second voltage generator circuit 42 that outputs voltage VREADLA.

Therefore, for example, the rising rate of voltage VREADLA transferred to the word line WL32 can be suppressed from becoming higher than the rising rate of voltage VREAD transferred to the word lines WL0 to WL30 and word lines WL33 to WL63.

That is, in this embodiment, the controller 6 snort-circuits the output terminal of the first voltage generator circuit 41 that generates voltage VREAD and the output terminal of the second voltage generator circuit 42 that generates voltage VREADLA in a period of (t1-t0). That is, as shown in FIG. 7 and FIG. 8, the potentials of the nodes N2 and N3 that are the output terminals thereof are set to the same potential in the period (t1-t0). If the selected word line WLN is WL31, the potentials of the word lines WL0 to WL30 and word lines WL32 to WL63 are set to the same potential. As a result, the potentials of the word lines WL0 to WL30 and word lines WL32 to WL63 rise at the same rising rate and then the potentials of the word lines WL0 to WL30 and word lines WL33 to WL63 are set to voltage VREAD after time t1.

That is, the controller 6 short-circuits the output terminal of the first voltage generator circuit 41 and the output terminal of the second voltage generator circuit 42 in a period of (t1-t0). Therefore, although the potential of the word line WL32 is set to voltage VREADLA at a certain time t, the potentials of the word lines WL0 to WL30 and word lines WL33 to WL63 are still kept at 0 [V] and occurrence of a potential difference between the word lines WL can be prevented. This is the same even if the number of word lines WL for each block BLK unit becomes larger. Therefore, it is possible to solve a problem that, for example, only the potential of the word line WL32 is set to voltage VREADLA and, as a result, the potential of the n$^+$-type impurity diffusion layer 103 in the memory cell transistor MT whose control gate 107 is connected to the word line WL32 is boosted and an abrupt potential difference occurs between the n$^+$-type impurity diffusion layer 103 and the control gate 107 of the memory cell transistor MT corresponding to the word line WL33.

Thus, a voltage approximately equal to voltage VREADLA will not be applied between the n$^+$-type impurity diffusion layer 103 whose potential rises to a value near voltage VREADLA, for example, and the control gate 107 functioning as the word line WL33. As a result, as shown in FIG. 9, a leakage current (GIDL) will not occur due to band-to-band tunneling in a portion in which the drain region and the control gate 107 functioning as the word line WL32 overlap.

As a result, the GIDL current will not occur and the operation reliability can be enhanced because the above voltages are transferred to the word lines WL.

Further, voltages are transferred to the word lines WL0 to WL30 and word lines WL32 to WL63 of the selected block BLK by means of the first, second voltage generator circuits 41, 42 in the period (t1-t0). That is, the voltage driving ability (pumping ability) for loads of the word lines WL0 to WL30 and word lines WL32 to WL63 can be enhanced by providing the second voltage generator circuit 42 in addition to the first voltage generator circuit 41. Therefore, a time required for reaching voltage VREAD can be reduced in comparison with a case wherein the potentials of the word lines WL0 to WL30 and word lines WL33 to WL63 are charged to voltage VREAD only by means of the first voltage generator circuit 41. That is, as shown in FIG. 7 and FIG. 8, the time is reduced from t'1 to (t1-t0), and therefore, the time required for shifting the operation to the data read operation (sense) by the sense amplifier 5 in the next operation can be reduced.

In this case, t'1 indicates a time required for the potentials of the word lines WL0 to WL30 and word lines WL33 to WL63 to reach voltage VREAD after the potential of the word line WL32 has reached voltage VREADLA in a case where the output terminals are not short-circuited. Further, it is supposed that the relationship of t'1>(t1-t0) is set. Thus, the operation speed of the whole circuit can be enhanced.

<Modification>

Next, a semiconductor device and the control method for the semiconductor device according to a modification of the first embodiment is explained with reference to FIG. 10. FIG. 10 is a time chart for illustrating a voltage transfer operation at a read operation time in a NAND flash memory according to the modification.

FIG. 10 is a time chart showing enable signal EN supplied to the local pump 61, a potential applied to the gate of the MOS transistor 71, signal TG, the on-off state of the MOS transistor 23, potentials of the nodes N2, N3 and potentials of the word lines WL.

In the modification, a case of voltage VREAD>voltage VREADLA is explained. That is, the relationship of voltage VREADLA=voltage (VREAD-α) is set. The timing of the voltage transfer operation is controlled by the controller 6. The same operation as the read operation explained in the first embodiment is emitted. Further, the selected word line WLN is set to WL31. That is, voltage VREADLA is transferred to the unselected word line WL32 and voltage VREAD is transferred to the other unselected word lines WL0 to WL30 and unselected word lines WL33 to WL63.

<Time t0 to t1>

As shown in FIG. 10, a signal supplied to the gate of the MOS transistor 71 is set to the 'L' level by means of the controller 6 at time t1 before the potentials of the nodes N2, N3 and word line WL reach voltage VREADLA. That is, enable signal EN supplied to the local pump 61 is set to the 'L' level by means of the control unit 60 at time t1. As a result, the MOS transistor 71 is turned off and the nodes N2 and N3 are electrically isolated.

Then, since the load for the second voltage venerator circuit 42 is set to the unselected word line WL32, the rising rate of voltage VREADLA generated from the second voltage generator circuit 42 is increased at time t1. That is, a voltage inclination is made abrupt.

<Time t2 to t3>

The potentials of the node N3 and unselected word line WL32 reach voltage VREADLA at time t2. Then, the potentials of the unselected word lines WL0 to WL30 and unselected word lines WL33 to WL63 reach voltage VREAD at time t3.

<Effect of Modification>

In the semiconductor device and the control method for the semiconductor device according to the modification, the following effect (2) can be obtained in the case of voltage VREAD >voltage VREADLA.

(2) Operation Speed can be Enhanced:

In the semiconductor device and the control method for the semiconductor device according to the modification, the controller 6 turns off the MOS transistor 71 at time t1 before the potential of the node N3 reaches voltage VREADLA. As a result, the voltage transfer operation with respect to the word line WL can be smoothly performed. This is because the MOS transistor 71 is not turned off immediately after the potential of the node N3 has reached voltage VREADLA.

Therefore, it becomes possible to prevent the potentials of the node N3 and word line WL32 from overshooting from voltage VREADLA immediately after the MOS transistor 71 is turned off, that is, the nodes N2 and N3 are electrically isolated.

Based on the above explanation, in the semiconductor device and the control method for the semiconductor device according to the modification of this embodiment, the time required for a voltage overshooting from voltage VREADLA to return to voltage VREADLA can be prevented from being increased. Thus, the operation speed can be enhanced and the operation speed of the whole chip can be enhanced according to the semiconductor device of this embodiment.

[Second Embodiment]

Next, a semiconductor device and the control method for the semiconductor device according to a second embodiment is explained. The semiconductor device according to the second embodiment further includes a sixth voltage generator circuit 46 that generates and outputs voltage VREADK. The explanation for the same configuration as that of the first embodiment is omitted.

Figure 11:
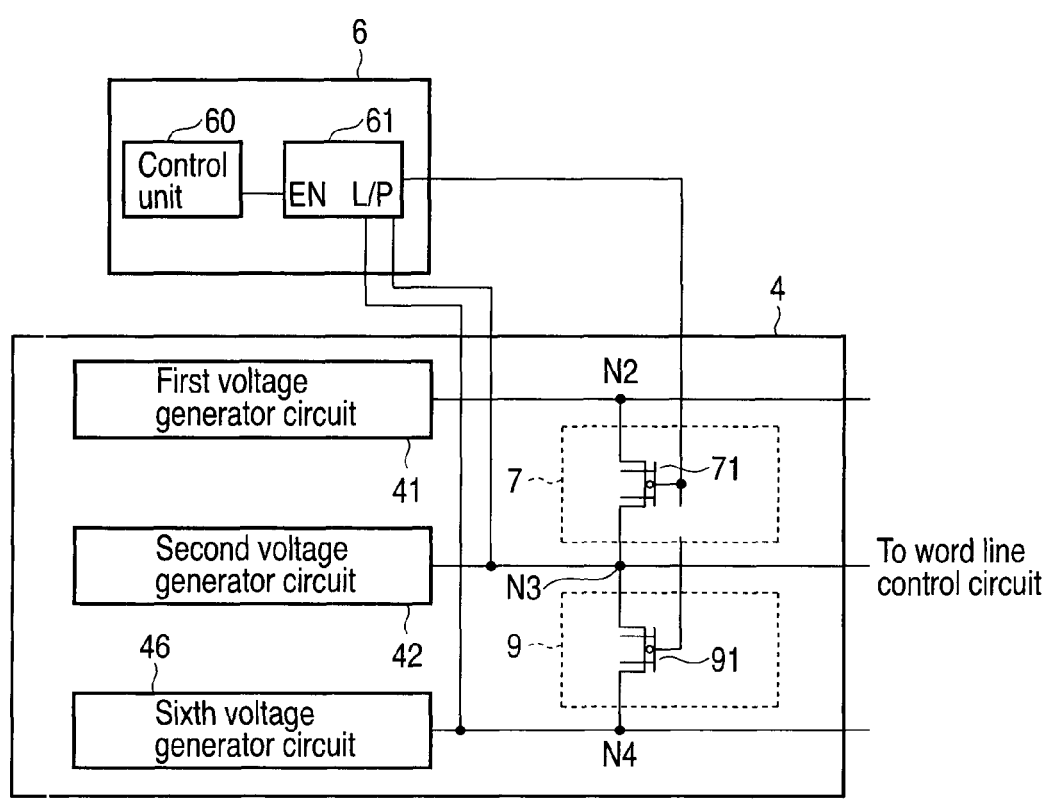
FIG. 11 is a block diagram of a voltage generator circuit and controller according to a second embodiment.

FIG. 11 is a block diagram of a voltage generator circuit 4 provided in the semiconductor device according to this embodiment. In FIG. 11, the third voltage generator circuit 43, fourth voltage generator circuit 44 and fifth voltage generator circuit 45 are emitted.

The voltage generator circuit 4 further includes the sixth voltage generator circuit 46 and short circuit 9 as shown in FIG. 11. A MOS transistor 91 functions as a short circuit. One end of the current path of the MOS transistor 91 is connected to a node N3, the other end thereof is connected to a node N4 and the gate thereof is supplied with a signal from the controller 6. Therefore, the nodes N2, N3 and N4 are short-circuited by causing the controller 6 to supply a signal of 'H' level to the MOS transistor 91 in response to enable signal EN.

Further, the output terminal of the sixth voltage venerator circuit 46 is connected to the node N4. The timing at which the 'H' level signal is supplied to the gate of the MOS transistor 91 is set at the same timing as in the case of the MOS transistor 71. As a result, the potentials of the nodes N2 to N4 are set to the same potential while the MOS transistors 71 and 91 are kept in the on state.

Further, the sixth voltage generator circuit 46 has the same configuration as that of FIG. 4 in the first embodiment. That is, it generates voltage VREADK by controlling a value of the limiter 50. Voltage VREADK is a voltage that turns on the memory cell transistor MT and the magnitude thereof can be changed based on the threshold distribution of the memory cell transistor MT like voltage VREADLA.

That is, voltage VREADK is set to voltage (VREAD+β) or voltage (VREAD-β) (voltages (VREAD-β) and voltage (VREAD+β) are hereinafter respectively referred to as voltages VREADK_ and VREADK_+ as required). Values of α and β may be set to the same value or set to satisfy the relationship of α>β or α<β. Further, voltage VREADK_ may be set to voltage (VREAD+β) as required. That is, in this case, voltage VREADK is always set higher than voltage VREAD.

If the selected word line WL is set to an Nth word line in FIG. 1, voltage VREADK is a voltage to be transferred to the (N−1)th word line WL or (N−1)th word line WL and (N+1)th word line WL.

The local pump 61 may use the potential of the node N4 as a reference voltage in addition to the potential of the node N3. That is, if the threshold voltage of the MOS transistor 91 is set to the same voltage as threshold voltage $Vth_{71}$ of the MOS transistor 71, the local pump 61 may use the potential of the node N3 or N4 as a reference voltage and apply the potential of the sum of the reference voltage and $Vth_{71}$ to the gates of the MOS transistors 71 and 91.

In a case where the threshold voltage of the MOS transistor 91 is set to $Vth_{91}$, the local pump 61 may apply a voltage (potential of the node N3 or N4+voltage $Vth_{91}$) to the gates of the MOS transistors 71 and 91 if voltage $Vth_{91}$>voltage $Vth_{71}$. Further, if voltage $Vth_{71}$>voltage $Vth_{91}$, the local pump 61 may apply a voltage (potential of the node N3 or N4+voltage $Vth_{71}$) to the gates of the MOS transistors 71 and 91.

If voltages $Vth_{71}$, $Vth_{91}$ are different from each other, the local pump 61 may separately supply 'H' level signals to the gates of the MOS transistors 71 and 91. That is, the local pump 61 may apply a voltage (potential of the node N3 or N4+voltage $Vth_{91}$) to the gate of the MOS transistor 91 while applying a voltage (potential of the node N3 or N4+voltage $Vth_{71}$) to the gate of the MOS transistor 71.

<Read Operation of NAND Flash Memory>

Next, first and second cases of the read operation by use of voltages VCGR, VREAD, VREADLA and VREADK in the NAND flash memory are explained with reference to FIG. 12A, FIG. 12B and FIG. 13.

<First Case of Read Operation>

First, the first case of the read operation is explained with reference FIG. 12A, FIG. 12B. In the first case of the read operation, a case where voltage VREADK is transferred only to the word line WL(N−1) when voltage VCGR is transferred to the selected word line WLN is explained. In this case, voltage VREADLA is transferred to the word line WL(N+1). Since the read method for the selected word line WLN and unselected word line WL(N+1) is the same as that in the first embodiment, the explanation thereof is omitted.

<Step 1>

As shown in FIG. 12A, the first voltage generator circuit 41 transfers voltage VREAD to the word line WL(N−3) to word line WLN, word line WL(N+2) and word line WL(N+3). Further, the sixth voltage generator circuit 46 transfers voltage VREAD to the word line WL(N−1).

<Step 2>

As shown in FIG. 12B, the sixth voltage generator circuit 46 transfers voltage VREADK to the word line WL(N−1). As a result, the memory cell transistors MT connected to the word lines WL(N−3) to WL(N+3) are turned on to permit the sense amplifier 5 to perform the data read operation via a bit line BL (not shown).

<Second Case of Read Operation>

Next, a case wherein voltage VREADK is transferred to the word line WL(N−1) and word line WL(N+1) is explained with reference to FIG. 13. FIG. 13 shows a state in which data is read from the memory cell corresponding to the selected word line WLN after step 1 of FIG. 12. That is, the third voltage generator circuit 43 transistors voltage VCGR to the word line WLN.

Figure 13:
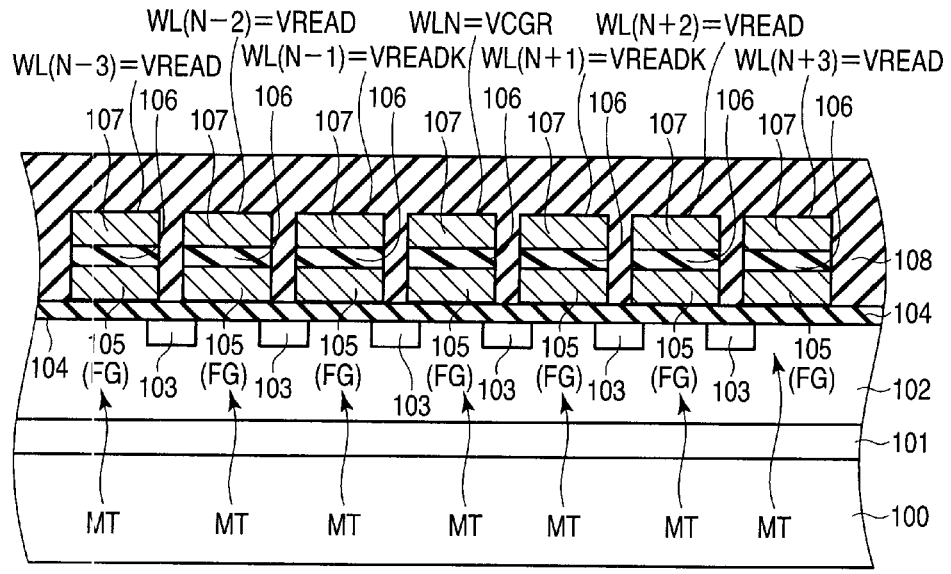
FIG. 13 shows a data read operation of the memory cell transistor according to the second embodiment.

As shown in FIG. 13, voltage VREADK is transferred to the word lines WL(N−1) and WL(N+1). As described before, voltage VREADK is set to either voltage VREADK_ or voltage VREADK_+. That is, voltage VREADK is transferred to the word line WL(N−1) and word line WL(N+1) by the number of times corresponding to the number of cases.

The memory cell transistors MT whose control gates 107 are applied with voltages VREADK, VREAD and VCGR are turned on. As a result, channels are formed directly below the memory cell transistors MT connected to the word lines WL(N−3) to WL(N+3) and the sense amplifier 5 performs the data read operation via the bit line BL (not shown).

<Magnitude Relationship between Voltage VREAD, Voltage VREADLA and Voltage VREADK>

Next, the magnitude relationship between voltages generated from the first voltage generator circuit 41, second voltage generator circuit 42 and sixth voltage generator circuit 46 is explained. The magnitude relationship between voltages generated from the first voltage generator circuit 41, second voltage generator circuit 42 and sixth voltage generator circuit 46 is divided into the following five patterns (I) to (V). In this case, the relationships at the data read operation times in FIG. 12A and FIG. 12B are set to (I) to (V) and the data read voltage relationships in FIG. 13 are set to (VI) and (VII).

(I) Voltage VREAD≦voltage VREADLA≦voltage VREADK (II) Voltage VREADK≦voltage VREAD≦voltage VREADLA (III) Voltage VREADLA23 voltage VREAD≦voltage VREADK (IV) Voltage VREADK≦voltage VREADLA≦voltage VREAD (V) Voltage VREAD≦voltage VREADK≦voltage VREADLA (VI) Voltage VREADK_<voltage VREAD <voltage VREADK_+

(VII) Voltage VREAD≦voltage VREADK_≦voltage VREADK_+

<Voltage Transfer Operation at Read Operation Time (Third Case)>

Figure 14:
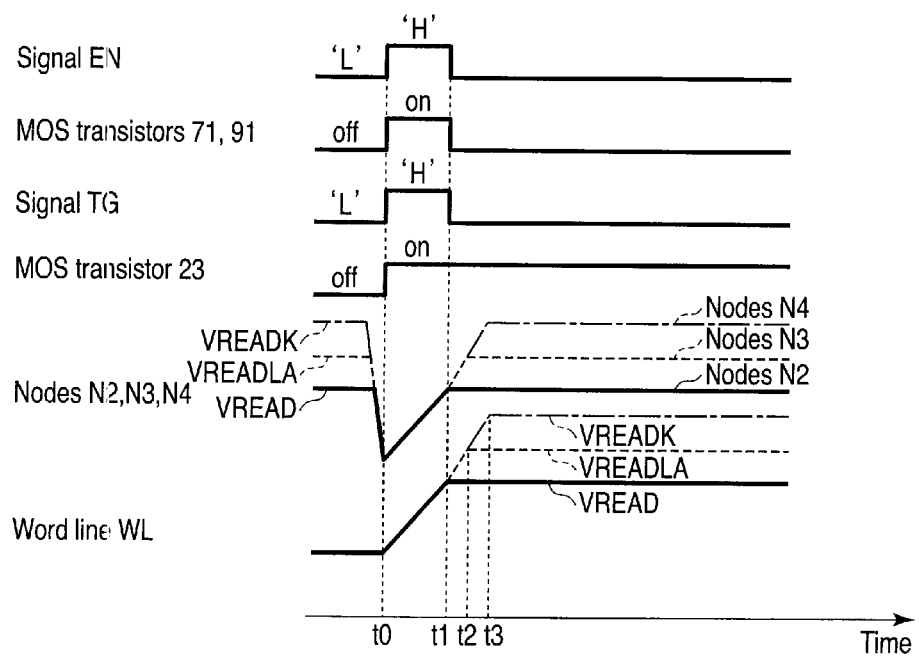
FIG. 14 is a time chart for illustrating a voltage transmission operation at a data read time in a NAND flash memory according to the second embodiment.

Next, the voltage transfer operation at the read operation time in the NAND flash memory explained above is explained with reference to FIG. 14. FIG. 14 is a time chart of enable signal EN supplied to the local pump 61, a potential applied to the gate of the MOS transistor 71, potentials of the nodes N2, N3 and potentials of the word lines WL. The timings of the voltage transfer operations are controlled by the controller 6. In this case, the potentials of the nodes N2, N3 in the case (I) are raised as one example. Further, the explanation for the same operation as the read operation (first and second cases) explained above is omitted.

<Before Time t0>

As shown in FIG. 14, signal TG is set to the 'L' level to turn off the MOS transistor 23 before time t0 and the potentials of the nodes N2 to N4 are respectively set to voltages VREAD, VREADLA and VREADK.

(Time t0 to t1>

After time t0, the MOS transistors 71, 91 are turned on to short-circuit the nodes N2 to N4. Further, since signal TG is set at the 'H' level, the MOS transistor 23 is turned on, that is, the load (parasitic capacitor of the word line WL) and the nodes N2 to N4 are electrically connected. Therefore, output voltages of the first, second and sixth voltage generator circuits 41, 42 and 46 are temporarily reduced and then the potentials of the nodes N2 to N4 rise at the same rising rate.

When time t1 is reached, the controller 6 switches enable signal EN to the 'L' level. That is, an output of the local pump 61 is set to the 'L' level. At this time, since the relationship of voltage VREAD voltage VREADLA <voltage VREADK is set, the controller 6 controls time to set the potentials of the nodes N2 to N4 to voltage VREAD at time t1. Further, at this time, the potential of the word line WL is set to voltage VREAD.

Since the MOS transistors 71, 91 are simultaneously turned off at time t1, the nodes N2 to N4 are electrically isolated.

<Time t1 to t3>

The potential of the node N3 reaches voltage VREADLA at time t2. For example, if the selected word line WLN is set to WL31, the potential of a word line WL32 adjacent to the selected word line WL31 reaches voltage VREADLA.

Further, the potential of a word line WL30 and the potential of the node N4 reach voltage VREADK at time t3.

The voltage transfer operation in the case (I) is explained above, but the same operation is performed in the cases (II) to (V). That is, the controller 6 maintains the on state of the MOS transistors 71 and 91 to short-circuit the nodes N2 to N4 until the potential one of the nodes N2 to N4 reaches one of voltages VREAD, VREADLA and VREADK.

After this, when the potential of one of the nodes N2 to N4 reaches one of the above voltages, the MOS transistors 71, 91 are turned off. Then, the potential of the node whose potential does not reach a desired voltage rises to a voltage generated from the voltage generator circuit 4.

<Effect of this Embodiment>

In the semiconductor device and the control method for the semiconductor device according to this embodiment, the effect (1) can be attained. That is, the operation reliability of the semiconductor device can be enhanced. In the semiconductor device and the control method for the semiconductor device according to this embodiment, the potentials of the word lines WL to which voltages VREADLA, VREADK and VREAD are transferred rise at the same rising rate even when voltage VREADK is transferred to the word line WL in addition to voltage VREADLA explained in the first embodiment. Therefore, there occurs no problem that a time lag occurs in the potential rising operation of the word line WL as in the conventional case explained in the first embodiment. That is, in the semiconductor device according to this embodiment, a GIDL current can be suppressed and the operation reliability can be enhanced.

If one of voltages VREADLA and VREADK is higher than voltage VREAD, the controller 6 performs the operation explained in the modification to attain the effect (2). That is, also, in this embodiment, enable signal EN is switched to the 'L' level to turn off the MOS transistors 71, 91 before the potentials of the nodes N2 to N4 reach one of voltages VREADLA and VREADK in the cases (II), (III) and (IV). As a result, the voltage transfer operation with respect to the word line WL can be smoothly performed and a problem that an operation delay occurs due to overshooting from a desired voltage can be avoided.

Further, in the semiconductor device according to this embodiment, the controller 6 transfers the sum of the threshold voltages of the MOS transistors 71, 91 and a second voltage to the gates of the MOS transistors 71 and 91 while monitoring the second potential of the second node.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first voltage generator circuit which outputs a first voltage to a first node;
a second voltage generator circuit which outputs a second voltage to a second node;
a first MOS transistor capable of short-circuiting the first node and second node; and
a controller which performs a control operation to short-circuit the first node and second node by turning on the first MOS transistor, controlling a period in which the first MOS transistor is kept in an on state based on time.

2. The device according to claim 1, wherein a first load is connected to the first node, and a second load larger than the first load is connected to the second node,
when a potential of the first load reaches the second voltage in a case where the first voltage is higher than the second voltage at a read time, the controller turns off the first MOS transistor.

3. The device according to claim 1, wherein a first load is connected to the first node, and a second load larger than the first load is connected to the second node,
in a case where the second voltage is higher than the first voltage at a read time, the controller turns off the first MOS transistor before a potential of the second load reaches the first voltage.

4. The device according to claim 1, wherein the first MOS transistor is one of an n-type intrinsic MOS transistor, depression-type MOS transistor, and enhancement-type MOS transistor.

5. The device according to claim 1, wherein the controller senses a potential of the second node, and
transfers a voltage equal to the sum of the above potential and a threshold voltage of the first MOS transistor to the gate of the first MOS transistor.

6. The device according to claim 1, further comprising:
a third voltage generator circuit which outputs a third voltage to a third node; and
a second MOS transistor capable of short-circuiting the second node and the third node,
wherein the controller simultaneously performs on and off switching operations of the first MOS transistor and second MOS transistor.

7. The device according to claim 6, wherein the controller senses a potential of one of the second node and the third node, and
transfers one of a first voltage equal to the sum of the above potential and a first threshold voltage of the first MOS transistor and a second voltage equal to the sum of the above potential and a second threshold voltage of the second MOS transistor to the gates of the first and second MOS transistors.

8. The device according to claim 1, further comprising:
a memory cell array including plural memory cells whose current paths are serially connected and each of which includes a charge storage layer and control gate; and
word lines connected to the control gates of the memory cells and each used as one of the first and second loads;
wherein the first and second voltage generator circuits transfer one of the first and second voltages to the word lines.

9. A semiconductor device comprising:
a memory cell array including i memory cells (i is an integral number larger than 2) capable of holding data each of which includes a charge storage layer and control gate and the i memory cells are serially connected along a current path; and
a voltage generator circuit which generates a first voltage and second voltage, transferring the first and second voltages to word lines connected to the control gates of the memory cells,
wherein the voltage generator circuit
transfers the first voltage to the word line connected to the control gate of the ith memory cell, and
transfers the second voltage to the word lines connected to the control gates of the (i+1)th and (i+2)th memory cells which are arranged on a drain side of the ith memory cell.

10. The device according to claim 9, wherein the first voltage is a voltage corresponding to data held by the ith memory cell.

11. The device according to claim 9, further comprising:
a MOS transistor capable of short-circuiting a first node and second node; and
a controller which performs a control operation to turn on the MOS transistor to short-circuit the first node and second node,
wherein the voltage generator circuit includes
a first voltage generator circuit which generates the first voltage and outputs the first voltage to the first node, and
a second voltage generator circuit which generates the second voltage and outputs the second voltage to the second node, and
the controller controls a period in which the MOS transistor is maintained in an on state based on time.

12. The device according to claim 11, wherein the controller
senses a potential of the second node, and
transfers a voltage equal to the sum of the above potential and a threshold voltage of the MOS transistor to the gate of the MOS transistor.

13. The device according to claim 9, wherein the MOS transistor is one of an n-type intrinsic MOS transistor, depression-type MOS transistor, and enhancement-type MOS transistor.

14. The device according to claim 11, wherein a word line used as a first load is connected to the first node, and a word line used as a second load larger than the first load is connected to the second node, and
in a case where the second voltage is higher than the first voltage, the controller turns off the first MOS transistor before a potential of the second load reaches the first voltage.

15. A control method of a semiconductor device comprising:
causing a first voltage generator circuit to generate a first voltage and output the first voltage to a first node;
causing a second voltage generator circuit to generate a second voltage and output the second voltage to a second node;
causing a controller to set a first MOS transistor in an on state and short-circuit the first node and second node; and causing the controller to control a period in which the first MOS transistor is maintained in the on state based on time.

16. The method according to claim 15, further comprising:
causing the first voltage generator circuit to transfer the first voltage to a first load via the first node;
causing the second voltage generator circuit to transfer the second voltage higher than the first voltage to a second load larger than the first load via the second node; and
causing the controller to turn off the first MOS transistor before a potential of the second load reaches the first voltage.

17. The method according to claim 15, further comprising:
causing the first voltage generator circuit to transfer the first voltage to a first load via the first node;
causing the second voltage generator circuit to transfer the second voltage to a second load larger than the first load via the second node; and
if the first voltage is higher than the second voltage at a read time, causing the controller to turn off the first MOS transistor at the timing of a potential of the first load reaching the second voltage.

18. The method according to claim 15, further comprising:
causing the controller to sense a potential of the second node; and
causing the controller to transfer a voltage equal to the sum of the above potential and a threshold voltage of the first MOS transistor to the gate of the first MOS transistor.

19. The method according to claim 15, further comprising:
causing a third voltage generator circuit to generate a third voltage and output the third voltage to a third node;
causing the controller to turn on the first and second MOS transistors and short-circuit the first to third nodes; and
causing the controller to simultaneously perform on and off switching operations of the first and second MOS transistors.

20. The method according to claim 16, further comprising:
transferring the first voltage to a control gate of an ith memory cell among plural memory cells whose current paths are serially connected via the first node at a data read time; and
transferring the second voltage to a control gate of an (i+1)th memory cell arranged on a drain side of the ith memory cell via the second node.

\* \* \* \* \*